United States Patent
Sadd

(10) Patent No.: US 6,400,610 B1
(45) Date of Patent: Jun. 4, 2002

(54) MEMORY DEVICE INCLUDING ISOLATED STORAGE ELEMENTS THAT UTILIZE HOLE CONDUCTION AND METHOD THEREFOR

(75) Inventor: Michael Alan Sadd, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/610,078

(22) Filed: Jul. 5, 2000

(51) Int. Cl.$^7$ .............................................. G11C 16/04
(52) U.S. Cl. ............................ 365/185.29; 365/185.28; 365/185.18; 365/218
(58) Field of Search ............................ 365/185.29, 218, 365/185.18, 185.28

(56) References Cited

U.S. PATENT DOCUMENTS

| | | | |
|---|---|---|---|
| 5,937,295 A | * 8/1999 | Chen et al. | 438/257 |
| 6,054,349 A | * 4/2000 | Nakajima et al. | 438/257 |
| 6,166,401 A | * 12/2000 | Forbes | 257/77 |
| 6,310,376 B1 | * 10/2001 | Ueda et al. | 257/315 |
| 6,320,784 B1 | * 11/2001 | Muralidhar et al. | 365/151 |
| 6,342,716 B1 | * 1/2002 | Morita et al. | 257/315 |

OTHER PUBLICATIONS

Han et al., "Programming Characteristics of P–Channel Si Nano–Crystal Memory," IEEE Electron Device Letters, vol. 21, No. 6, Jun. 2000, pp. 313–315.

Han et al., "Comparison of the characteristics of tunneling oxide and tunneling ON for P–channel Nano–crystal Memory," IEEE, pp. 233–236 (1999).

Han et al., "Characteristics of P–channel Si Nano–crystal Memory," IEEE TENCON, pp. 1140–1142. (1999).

* cited by examiner

Primary Examiner—Andrew Q. Tran
(74) Attorney, Agent, or Firm—Robert A. Rodriguez; Paul Anderson

(57) ABSTRACT

A memory device is presented that utilizes isolated storage elements (200) in a floating gate structure, where tunneling holes (404) are used to program the device and tunneling electrons (504) are used to erase the device. Formation of such a device includes forming a thin tunnel dielectric layer (102) that may be less than 3.5 nanometers. When the control gate electrode (204) of the memory device is negatively biased, the thinner tunnel dielectric (102) allows holes to migrate through the tunnel dielectric to positively charge the isolated storage elements (200). When the device is to be erased, the control gate electrode (204) is positively biased, and rather than forcing the holes back across the tunnel dielectric, electrons present in the channel (402) are pulled through the tunnel dielectric where they recombine with the holes in the floating gate such that the stored positive charge is substantially neutralized.

8 Claims, 2 Drawing Sheets

MEMORY DEVICE INCLUDING ISOLATED STORAGE ELEMENTS THAT UTILIZE HOLE CONDUCTION AND METHOD THEREFOR

FIELD OF THE INVENTION

The invention relates generally to semiconductor devices and more particularly to a semiconductor memory device that utilizes isolated storage elements that rely on hole conduction and methods for forming and using such a semiconductor memory device.

RELATED ART

Electrically Erasable Programmable Read Only Memory (EEPROM) structures are commonly used in integrated circuits for non-volatile data storage. As is known, EEPROM device structures commonly include a floating gate that has charge storage capabilities. Charge can be forced into the floating gate structure or removed from the floating gate structure using control voltages. The conductivity of the channel underlying the floating gate is significantly altered by the presence of charge stored in the floating gate. The difference in conductivity due to a charged or uncharged floating gate can be current sensed, thus allowing binary memory states to be determined. The conductivity difference is also represented by a shift in the threshold voltage ($V_T$) associated with the device in the two different states.

As semiconductor technology continues to evolve, the operating of voltages of semiconductor devices are often reduced in order to support low power applications. While such voltage reductions are desirable, the speed and functionality of the devices must also be maintained or improved. The lower limit for the programming and erase voltages is largely determined by the thickness of the tunnel dielectric through which charge carriers are exchanged between the floating gate and the underlying channel region.

In many prior art device structures, the floating gate is formed from a uniform layer of material such as polysilicon. In such prior art device structures, charge loss from the floating gate is dominated by leakage mediated by defects in the tunnel dielectric layer. Such charge leakage can lead to degradation of the memory state stored within the device and is therefore undesirable. In order to avoid such charge leakage, the thickness of tunnel dielectric is often increased. A thicker tunnel dielectric, however, requires higher programming and erasing voltages for storing and removing charge from the floating gate. In many cases, higher programming voltages require the implementation of charge pumps in order to increase the supply voltage to meet programming and erasing voltage requirements. Such charge pumps consume a significant amount of die area in an integrated circuit and therefore reduce memory array area efficiency and increase overall costs.

In order to reduce the required thickness in the tunnel dielectric and improve the area efficiency of the memory structures by reducing the need for charge pumps, the uniform layer of material used for the floating gate may be replaced with a plurality of isolated storage elements, which are also known as nanoclusters or nanocrystals. In combination, a plurality of isolated storage elements provide adequate charge storage capacity for the floating gate while remaining physically isolated from each other such that any leakage occurring with respect to a single isolated storage element via a local underlying defect does not cause charge to be drained from other isolated storage elements. Thus, the lack of lateral charge flow between the isolated storage elements ensures that leakage experienced by one isolated storage element does not propagate and cause charge loss in a number of isolated storage elements. As such, the tunnel dielectric can be thinned to near to the limit that would be acceptable if it were ideal and defect-free. Although there may be some leakage through defects in the oxide, such defects only cause charge loss in the isolated storage elements nearest the defects.

The majority of devices discussed in literature to date detect the presence or absence of electrons in the isolated storage elements. When programming such devices (adding charge to the isolated storage elements through the tunneling of electrons across the tunnel dielectric), the rate at which the electrons move across the tunnel dielectric is relatively fast. The nanoclusters, however, have an affinity for securely holding onto added electrons such that erasing times associated with removing the electrons from the isolated storage elements are typically much longer than the times associated with programming. This difference may be due to the presence of traps either within the isolated storage elements themselves or the surrounding material. Such traps can impede the ability for electrons that reside within those traps to utilize the applied potential to migrate across the tunnel dielectric.

The additional time required for erasing may also be due to the presence of a large number of electrons at the interface between the tunnel dielectric and the channel region for programming operations. Each of these electrons at the interface is a potential migratory electron that could move through the tunnel dielectric to add to the charged stored within the floating gate. When erasing charge stored in the floating gate, the number of electrons is more limited as the only potential migratory electrons are those stored in the floating gate. Therefore, even if the probability for movement across the tunnel dielectric for a single electron remains constant, the time over which all of the charge carriers required to erase the floating gate move across the tunnel dielectric will be greater than the time required for programming.

Memory structures that have differing programming and erasing times are undesirable in numerous applications where it may be beneficial to have the capability to program and erase individual memory cells. For example, Dynamic Random Access Memory (DRAM) type memory structures or EEPROM memory structures benefit from such individual cell programming and erasing capability. In contrast, flash memory structures are known to rely on a bulk erase operation that uniformly clears charge from the floating gate structures of the entire array such that all of the memory cells within the array are returned to an initial erased state. In such flash memory structures, longer erase times are often inconsequential, which is not the case in applications where individual memory cells need to be programmed and erased independently.

Therefore, a need exists for a memory device that utilizes isolated storage elements for charge storage, where the memory device provides symmetric programming and erasing timing characteristics.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a memory device that utilizes isolated storage elements in a floating gate structure, where tunneling of holes is used to program the device and tunneling of electrons is used to erase the device. Formation of such a device includes forming a tunnel dielectric layer that is often thinner (<3.5 nanometers) than that associated with devices that utilize the tunneling of electrons to program the floating gate. When the programming voltage is applied to the gate of the memory device, the thinner tunnel dielectric allows holes to migrate through the tunnel dielectric such that the programming speed that is comparable with prior art devices that utilize the movement of electrons through the tunnel dielectric to perform such a programming operation. When the device is to be erased, a positive potential is applied to the gate, and rather than forcing the holes back across the tunnel dielectric, electrons present in the channel are pulled through the tunnel dielectric where they recombine with the holes in the floating gate such that the stored positive charge is cancelled out. Because the step of erasing does not suffer from the potential hindrances associated with traps and a limited number of potential migratory charge carriers as described with respect to prior art devices above, the speed with which the device is erased can be configured to generally match the programming speed.

Figure 1:
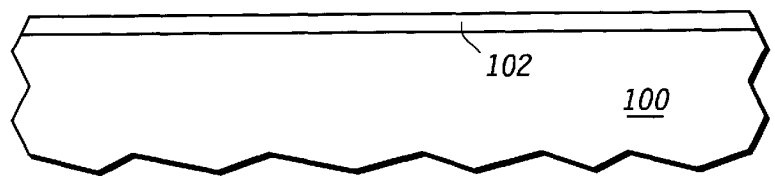
FIG. 1 illustrates a cross-sectional view of a portion of a semiconductor substrate that includes a formed layer of tunnel dielectric.

The invention can be better understood with respect to FIGS. 1–6. FIG. 1 illustrates a semiconductor device substrate 100 over which a tunnel dielectric layer 102 has been formed. The semiconductor device substrate 100 may be a silicon substrate such as a silicon wafer. The tunnel dielectric layer 102, which may also be referred to as tunnel oxide, may be silicon dioxide, silicon oxynitride, or other high dielectric constant (high-K) materials (for the purposes of this specification a high-K dielectric material is a material having a dielectric constant greater than approximately 5.0).

The tunnel dielectric layer 102 may be thermally grown or deposited. Due to the fact that the migratory characteristics of holes are different than those of electrons, thinner tunnel dielectric layers can be used when hole tunneling is used for programming the memory device.

In some embodiments, the thickness of the tunnel dielectric layer 102 is less than approximately 3.5 nanometers. A thickness of approximately 3.1 nanometers may be particularly suitable for use in EEPROM memory cells, where data retention characteristics on the order of 10 years are desirable. In other embodiments, the thickness of the tunnel dielectric layer 102 may be less than 2.0 nanometers. A tunnel dielectric thickness of approximately 1.9 nanometers may be particularly suitable for use in DRAM memory cells, where data retention times of one minute or less are desirable. The memory cell described herein may be included in an array that includes a plurality of memory cells, where each of the memory cells is selectively erasable and selectively programmable either individually or in desired groupings.

Figure 2:
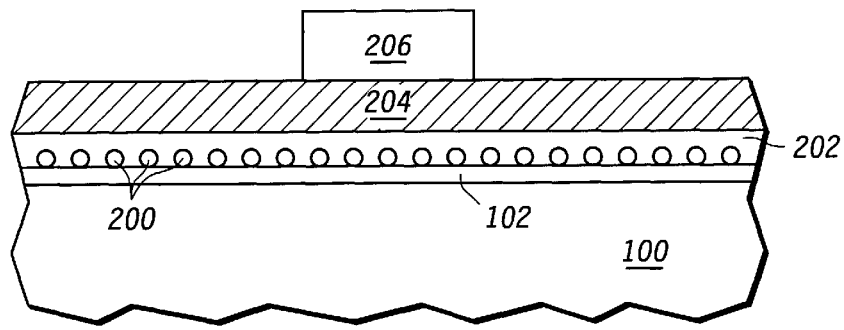
FIG. 2 illustrates a cross-sectional view of the portion of the semiconductor substrate of FIG. 1 following formation of a number of overlying layers associated with device formation where such a device includes isolated storage elements in accordance with a particular embodiment of the present invention.

FIG. 2 illustrates a cross-sectional view of the portion of the semiconductor substrate illustrated in FIG. 1 following additional processing steps. A plurality of isolated storage elements 200 is formed overlying the tunnel dielectric layer 102. Formation of the isolated storage elements may be accomplished by a variety of growing or deposition techniques. A desirable size for the isolated storage elements used in memory structures may be between 30–70 angstroms. In particular embodiments, a target diameter of approximately 50 angstroms may be appropriate. A 20% area density with respect to the coverage of the isolated storage elements on the tunnel dielectric layer 102 may be desirable in order to provide adequate charge storage without adding the potential for lateral charge movement that may lead to excessive leakage.

A control dielectric layer 202 is formed over the plurality of isolated storage elements 200 and the tunnel dielectric layer 102. The control dielectric layer 202 may be deposited using chemical vapor deposition (CVD), sputtering, or other deposition steps commonly used in semiconductor processing operations. The material included in the control dielectric layer 202 may be oxide-nitride-oxide (ONO), silicon oxide, a metal oxide, or the like.

Following formation of the control dielectric layer 202, a control electrode layer 204 is formed overlying the control dielectric layer 202. The control electrode layer 204 is preferably a gate material such as doped polysilicon or metal. Deposition of the control electrode layer 204 may be accomplished using CVD or other techniques commonly used to deposit such gate materials.

Following deposition of the control electrode layer 204, a layer of photo resist 206 is deposited and patterned to define the desired location of the gate for the semiconductor device. Such deposition and patterning steps are commonly used and well known in the art.

Figure 3:
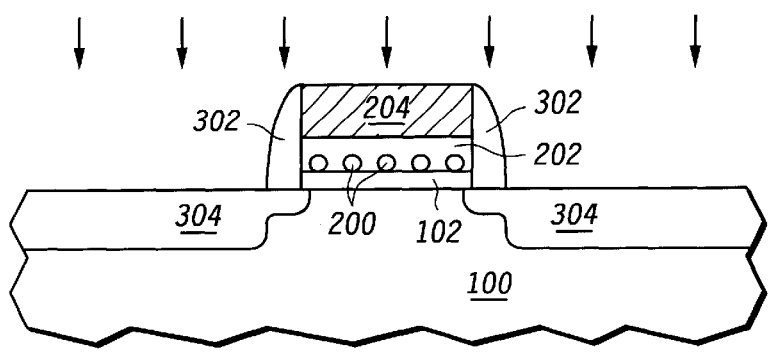
FIG. 3 illustrates a cross-sectional view of the portion of the semiconductor substrate of FIG. 2 following processing steps associated with gate, source, and drain formation in accordance with a particular embodiment of the present invention.

FIG. 3 illustrates a cross-sectional view of the portion of the semiconductor substrate of FIG. 2 following additional processing steps associated with device formation. Portions of the control electrode layer 204, control dielectric layer 202, plurality of isolated storage elements 200, and tunnel dielectric layer 102 have been removed through one or more etching operations to leave remaining portions that are included in the memory cell stack of the semiconductor device being formed. The remaining portion of the control electrode layer 204 is the gate for the semiconductor device, and this portion can be used to define an underlying channel region in the semiconductor device substrate 100 that underlies the gate. Etching of the other portions of the control electrode layer 204 may be accomplished using a reactive ion etch (RIE). Similar RIE etching can be used to remove the desired portions of the control dielectric layer 202.

Removal of the unwanted isolated storage elements may be accomplished by reacting those unwanted elements to form a compound that can be subsequently removed through etching operations. As is shown, the portion of the plurality of isolated storage elements 200 that underlie the remaining portion of the control electrode layer 204 (those included in the memory cell stack) are not reacted. Reacting may include reacting with oxygen, which creates silicon oxide in the case of silicon nanoclusters. The resulting silicon oxide is easily removed using standard etching techniques.

The etching operations used to remove the reacted isolated storage elements may also be used to remove the undesired portions of the tunnel dielectric layer 102. Such etching may be a non-selective wet etch operation. Thus, if the isolated storage elements are reacted to form silicon oxide, and the underlying tunnel dielectric layer 102 is silicon oxide, a wet etch operation using dilute hydrofluoric acid achieves the desired results.

Following removal of the undesired portions of the various layers to form the memory cell stack, an implant may be performed to form extension regions corresponding to the source and drain regions of the semiconductor device. In one embodiment, the device is a PMOS memory cell, and as such, the implant is a light P-type implant.

Following the implant associated with formation of the extension portions, spacers 302 may be formed to provide isolation for the gate portion of the device as well as a desirable offset for a subsequent implant operation. A higher dose implant operation is then performed to form the remaining portions of the source and drain regions 304. In the case of a PMOS memory cell, this is a P+ implant operation. Because of the inclusion of spacers 302, this higher dose implant operation is self-aligned. Note that field isolation regions (not shown in the FIGs) may be formed to isolate the device from neighboring devices.

The doping operations used to define the source and drain regions 304 preferably involve implantation of p-type ions, such as boron, arsenic, etc. This defines a PMOS or p-channel device such that the inclusion of positive charge within the floating gate structure will result in an increase in the threshold voltage ($V_T$) associated with forcing the device into a "on", or conducting state in which the channel between the source and drain allows for charge flow. The implant operations may also be used to dope the control gate portion of the memory cell stack with a p-type dopant.

Figure 4:
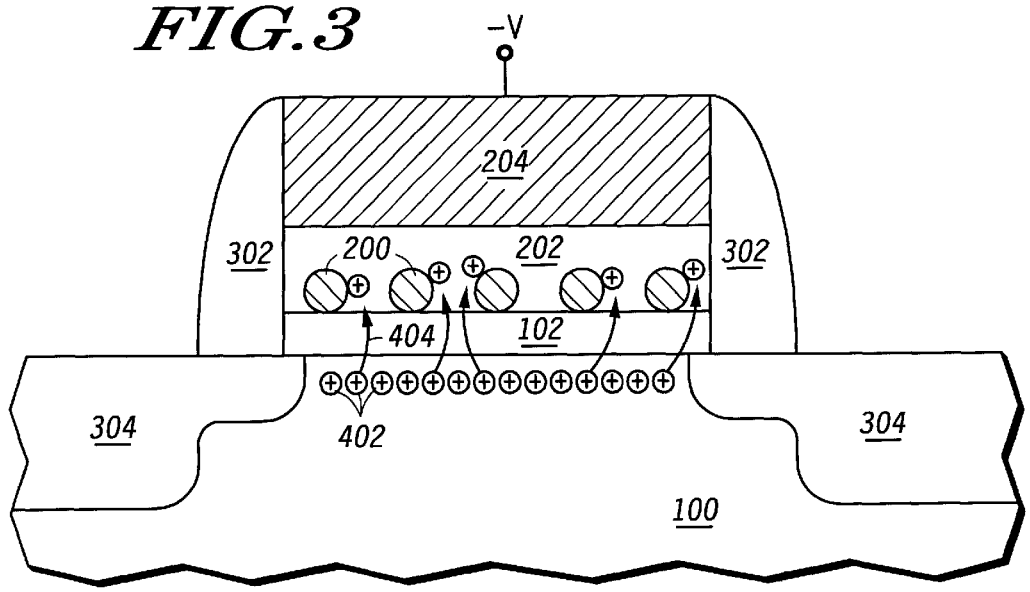
FIG. 4 illustrates an expanded cross-sectional view of the device formed as illustrated in FIGS. 1–3 during a programming operation in accordance with a particular embodiment of the present invention.

FIG. 4 illustrates the semiconductor device formed as described with respect to FIGS. 1–3 during a programming mode of operation. Because the device is PMOS, or p-channel, in order to achieve the desired alteration in the $V_T$ for the device, it is desirable to accumulate positive charge within the floating gate. In order to accumulate positive charge within the floating gate, a negative programming potential is applied to the control gate electrode of the device (the remaining portion of the control electrode layer 204) such that the control gate electrode is negatively biased. This results in holes 402 becoming concentrated along the boundary between the remaining portion of the tunnel dielectric 102 and the underlying channel region. A portion of these holes 404 will tunnel from the channel region, through the tunnel dielectric 102, and into the remaining isolated storage elements 200. As a result of the hole tunneling, the isolated storage elements 200 become positively charged.

The holes that migrate across the remaining portion of the tunnel dielectric 102 may become trapped in traps that are present either in the structure of the isolated storage elements or in the material immediately surrounding the isolated storage elements 200. In prior art solutions that relied on electron tunneling to program the memory devices, the storage of electrons in traps was undesirable as the electrons had to be freed from these traps in order to migrate back across to the channel region when erasure of the device was desired. As will be described below, storage of holes in traps does not present this problem in devices constructed based on the teachings provided herein.

The rate of tunneling for charge carriers is exponentially reduced with respect to an increase in the barrier height that corresponds to the particular charge carrier. The barrier height associated with electrons is less than that associated with holes. As such, either a higher programming voltage or a reduced tunnel dielectric thickness is required in order to achieve a corresponding level of tunneling of holes with respect to a specific level of electron tunneling that may be achieved using lower voltages or thicker tunnel dielectrics. Because the barrier height for holes is higher than that for electrons, thin tunnel dielectric layers do not present the danger of high leakage levels when holes are used for programming as opposed to electrons. Therefore, thinner tunnel dielectric layers can be used to achieve comparable programming times without endangering the non-volatility of the memory device.

As described above, one of the disadvantages of floating gate structures that utilize isolated storage elements and electrons for programming is that erasing the floating gates of such structures can require long erasing times due to either the limited number of electrons stored within the floating gate or due to the presence of traps that impede the mobility of electrons such that it is more difficult for them to tunnel back through the channel region. The present invention avoids such limitations by not relying on the mobility of holes in order to achieve erasure of the charge stored in the floating gate structure.

Figure 5:
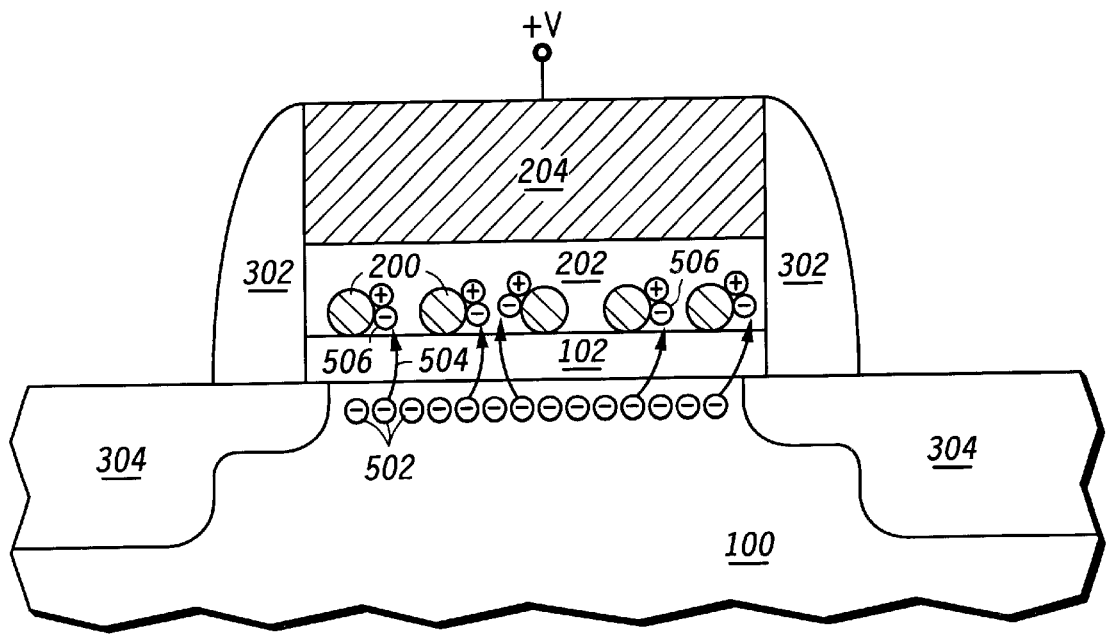
FIG. 5 illustrates an expanded cross-sectional view of the device as illustrated in FIG. 4 during a subsequent erasing operation in accordance with a particular embodiment of the present invention.

FIG. 5 illustrates a cross-sectional view of the device in FIG. 4 during an erasing operation. In order to substantially neutralize the positive charge stored within the floating gate structure, an erase potential, which is a positive voltage, is applied to the control gate electrode of the device such that it is positively biased. In a particular embodiment corresponding to EEPROM devices that may include a tunnel dielectric thickness of approximately 29–33 angstroms, the erase potential may be on the order of approximately 4 volts. In DRAM applications that utilize a tunnel dielectric thickness of approximately 15–21 angstroms, the erase potential may be on the order of 3 volts or less. Calculations have shown that in such examples, an erase time of approximately 74 microseconds can be achieved for the EEPROM devices, and an erase time of approximately 52 nanoseconds can be achieved for the DRAM devices.

Positively biasing the control gate electrode of the device causes a concentration of electrons 502 to result at the interface between the remaining portion of the tunnel dielectric layer 102 and the underlying channel region. As was the case with the holes in FIG. 4 above, a portion of the electrons of 504 will tunnel through the remaining portion of the tunnel dielectric layer 102 to add additional negative charge to any charge stored within the floating gate. When the tunneling electrons 506 reach the isolated charge storage elements 200, they effectively cancel out the positive charges introduced through the migration of holes as described with respect to FIG. 4 above. The neutralization of charge erases any stored potential within the floating gate structure. Such a neutralization of the charge stored may be initiated through the creation of an exiton pair as a hole that previously tunneled through is matched up with a tunneling electron. Eventually such recombination results in a neutral charge state that leaves the memory device erased.

The electrons 506 that tunnel through the remaining portion of the tunnel dielectric layer 102 and reach the isolated storage elements 200 combine with holes present in the floating gate structure. This is true whether the holes are stored within the general structure of the isolated storage elements or present in traps. As such, the degradation in erasing time associated with flushing charge carriers from traps is avoided. In some embodiments, the presence of traps may actually be desirable, as holes stored within traps are less likely leak across the remaining portion of the tunnel dielectric layer 102. This is because the traps inhibit a return tunneling ability of holes from the floating gate to the channel region. The reduced likelihood of such leakage may reduce volatility of the state of the memory device when programmed. When erasure of the positive charge stored on the floating gate is desired, however, it is relatively easy for the charge induced by these holes and traps to be negated by the influx of electrons.

Due to the fact that the presence of traps may be desirable, additional processing steps may be utilized during the formation of the isolated storage elements such that additional traps are created. Such additional processing steps may include forming a nitride layer over the tunnel dielectric layer 102 prior to forming the isolated storage elements. In other embodiments, encapsulation of the isolated storage elements using nitride or other materials that are known to include traps can be used to ensure the presence of desirable traps. In yet other embodiments, doping operations that intentionally alter the structure of the isolated storage elements to create traps are used.

As described earlier, the barrier height associated with electrons is lower than that associated with holes, and as such the electrons tunnel through the remaining portion of the tunnel dielectric layer 102 in response to the applied erase potential. In some instances, an overabundance of tunneling electrons may result such that the floating gate becomes negatively charged. Negatively charged isolated storage elements are not detrimental to sensing, as they increase the conductivity of a p-channel device in comparison with the conductivity of the device with neutrally charged isolated storage elements. It is important that any excess electrons stored in the isolated storage elements do not inhibit future programming operations, however. Such concerns are alleviated due to the fact that in later programming operations that rely on hole tunneling, the electrons are drawn out of the isolated storage elements relatively quickly because of the smaller electron barrier, and the tunneling holes tend first to recombine with any excess electrons. As such, all undesirable negative charge is typically purged from the floating gate within a limited amount of time such that no hysteresis with respect programming and erasing of the charge on the floating gate occurs.

Figure 6:
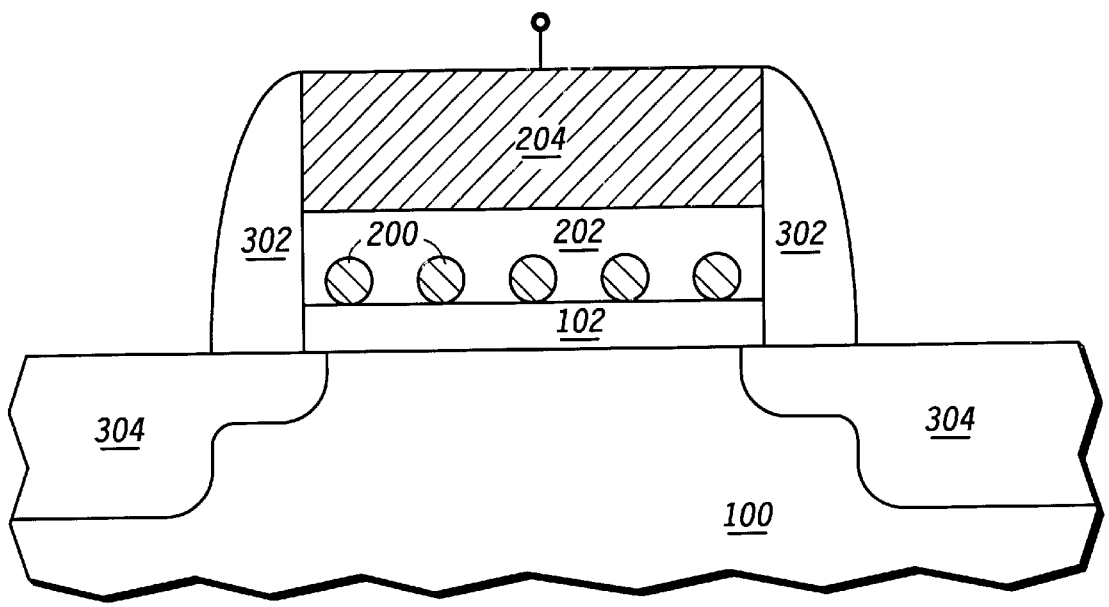
FIG. 6 illustrates an expanded cross-sectional view of the device illustrated in FIG. 5 following recombination of holes and electrons resulting in an erased device in accordance with a particular embodiment of the present invention.

FIG. 6 illustrates the device of FIG. 5 following recombination of the holes and electrons within the floating gate such that an erased, or neutral condition results. Due to the fact that recombination has eliminated the holes and electrons from the floating gate structure, subsequent application of a negative voltage on the gate can result in reprogramming of the device through the tunneling of holes through the remaining portion of the tunnel dielectric layer 102. As is apparent to one of ordinary skill in the art, subsequent erasure of the program state can be achieved as described with respect to FIG. 5 above through the application of a positive voltage on the gate such that electrons tunnel through and combine with the holes in the floating gate structure.

By utilizing hole tunneling for programming of the floating gate device and electron tunneling for erasing of the floating gate device, desirable programming and erasing characteristics can be achieved so that a balance between programming and erasing times is achieved. This allows such devices to be used in structures such as DRAM memory arrays and EEPROM memory arrays in which it is desirable to be able to achieve both programmed and erased states for an individual cell in a timely manner. Such timely programming and erasing of individual cells was not possible and prior art floating gate structures that utilized the tunneling of electrons to achieve the program state as the erasing times associated with such devices were significantly greater than those which can be achieved through utilization of the teachings provided herein.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for erasing a memory cell comprising:
    positively biasing a control gate electrode of the memory cell to produce electron tunneling from a channel region of the memory cell, through a tunnel dielectric of the memory cell, and into a floating gate of the memory cell, wherein as a result of electron tunneling into the floating gate and a recombination of electrons with holes, the holes being associated with positively charged isolated storage elements of the floating gate, the memory cell is erased by substantially neutralizing the positively charged isolated storage elements.

2. The method of claim 1, further comprising programming the memory cell,
    wherein programming the memory cell includes:
        negatively biasing the control gate electrode to produce hole tunneling from the channel region, through the tunnel dielectric, and into isolated storage elements, wherein holes resulting from hole tunneling produce a positive charge of the isolated storage elements.

3. The method of claim 2 wherein a thickness of the tunnel dielectric is less than approximately 3.5 nanometers.

4. The method of claim 3, wherein the memory cell is further characterized as an Electrically Erasable Programmable Read Only Memory (EEPROM) cell.

5. The method of claim 4, wherein the memory cell is further characterized as a memory cell within an array that includes a plurality of memory cells, wherein each of the plurality of memory cells is selectively erasable and selectively programmable.

6. The method of claim 2, wherein a thickness of the tunnel dielectric is less than approximately 2.0 nanometers.

7. The method of claim 6, wherein the memory cell is further characterized as a Dynamic Random Access Memory (DRAM) cell.

8. The method of claim 1, wherein the memory cell is further characterized as a PMOS memory cell.

* * * * *